United States Patent [19]

Farassat

[11] Patent Number: 5,277,354
[45] Date of Patent: Jan. 11, 1994

[54] DEVICE FOR MONITORING WIRE SUPPLY AND CONSUMPTION

[75] Inventor: Farhad Farassat, Taufkirchen, Fed. Rep. of Germany

[73] Assignee: F&K Delvotec Bondtechnik GmbH, Oberhaching, Fed. Rep. of Germany

[21] Appl. No.: 890,322

[22] Filed: May 26, 1992

[30] Foreign Application Priority Data
Mar. 16, 1990 [GB] United Kingdom ............. 9006000.5

Related U.S. Application Data

[63] Continuation of Ser. No. 656,483, Feb. 18, 1991, abandoned.

[51] Int. Cl.$^5$ ............................................. B23K 37/00
[52] U.S. Cl. ......................................... 228/4.5; 228/8
[58] Field of Search .................... 228/4.5, 104, 56.5, 228/103, 8, 102; 226/43; 242/45

[56] References Cited

U.S. PATENT DOCUMENTS

| | | | |
|---|---|---|---|
| 2,223,033 | 11/1940 | Friemel | 226/43 |
| 3,454,204 | 7/1969 | Fieldgate | 226/43 |
| 3,485,426 | 12/1969 | Apicella | 226/43 |
| 3,587,959 | 6/1971 | Glover | 226/43 |
| 4,572,421 | 2/1986 | Hug et al. | 228/4.5 |
| 4,696,708 | 9/1987 | Keller et al. | 228/103 |
| 4,763,826 | 8/1988 | Kulicke et al. | 228/4.5 |

FOREIGN PATENT DOCUMENTS

| | | | |
|---|---|---|---|
| 0257238 | 10/1988 | Japan | 228/4.5 |
| 0307233 | 12/1989 | Japan | 228/11 |

Primary Examiner—Richard K. Seidel
Assistant Examiner—James Miner
Attorney, Agent, or Firm—Hale and Dorr

[57] ABSTRACT

A device for incorporation in a wire bonding machine for monitoring the supply of wire from a wire supply spool to a bonding wedge. The device includes a mount (12) for rotatably mounting a wire supply spool (1); a guide wheel (7) mounted on a lever (8), which lever (8) can be deflected between a first position to which it is biassed by a spring (10) and a second position at which it activates sensor (A); and a motor (3) for driving the wire supply spool (1), which motor (3) is started by the sensor (A) when the sensor is activated by the lever (8). The device further comprises a means for stopping the motor (3) when a predetermined amount of wire (6) has been supplied. The wire (6) passes over the guide wheel (7) between the wire supply spool (1) and the bonding wedge so that the consumption of wire during a bonding cycle causes deflection of the lever (8) from its first position to its second position. The device makes it possible for the operator of the wire bonding machine to have available information about wire consumption and wire supply, in order to provide improved control of the bonding process.

3 Claims, 1 Drawing Sheet

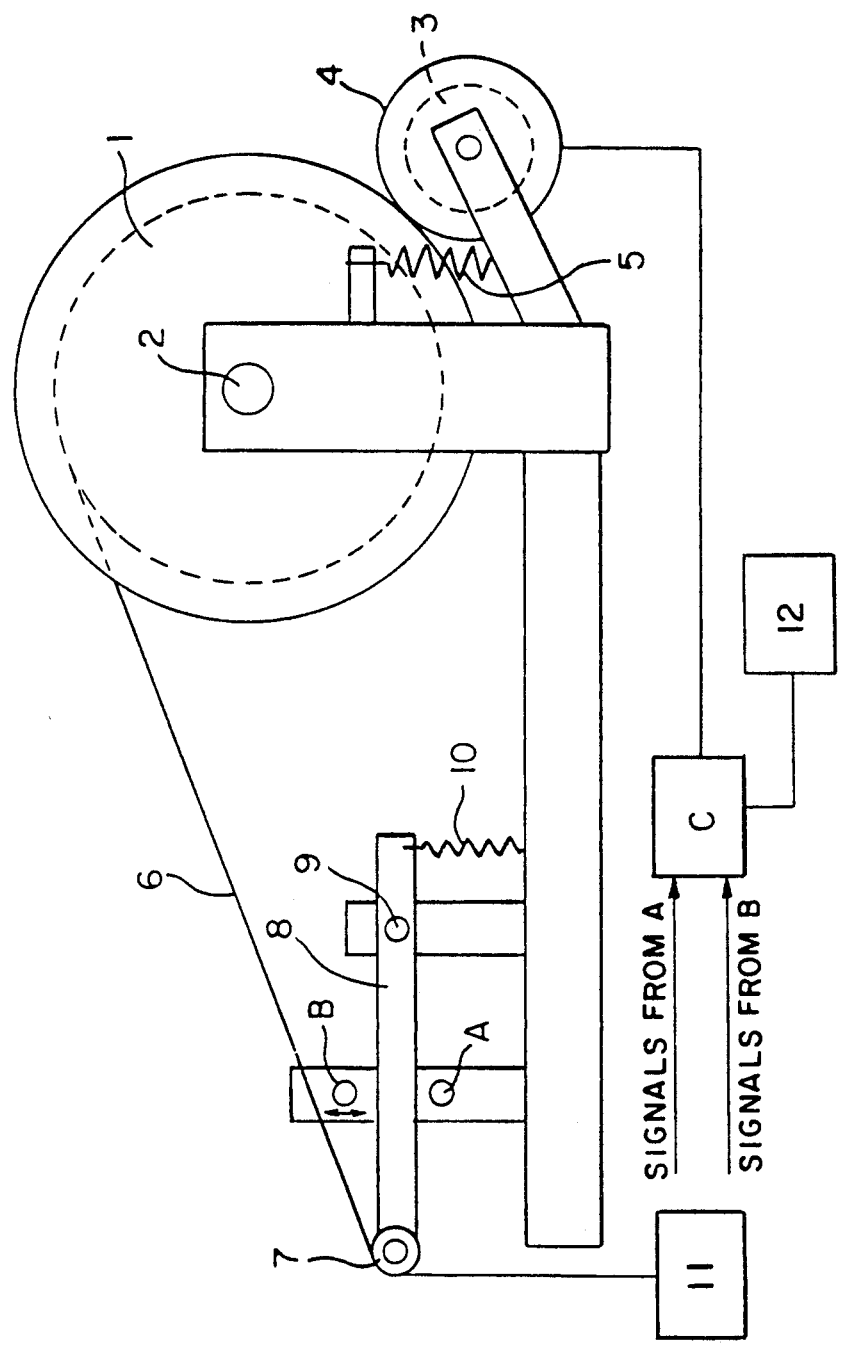

DEVICE FOR MONITORING WIRE SUPPLY AND CONSUMPTION

This is a continuation of Ser. No. 07/656,483 filed on Feb. 18, 1991, now abandoned.

BACKGROUND OF THE INVENTION

The present invention relates to a device for incorporation in an apparatus for automatic wire bonding, in particular for wedge bonding using thick wire having a diameter of at least 4 mil, which device makes it possible to monitor the amount of wire consumed during wire bonding, and to monitor the wire for breakages or feeding failures.

Wire bonding is the process of making electrical connections in semiconductor components by means of metal wire. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of wire bonding techniques have been developed, and one which has been particularly successful is a microwelding technique using ultrasound. An automatic wire bonding apparatus on which such a technique can be operated is described in German Patent Application No. P 33 43 738. Aluminum wire, in contact with the contact surface to which it is to be bonded, is moved vigorously in the direction of the surface to which it is to be bonded so that its oxide layer breaks open. The wire is then subjected to pressure, and a permanent junction is created between the two materials. Motion of the wire is generated by an ultrasonic transducer excited by an ultrasonic generator to produce high-frequency mechanical vibrations.

In the particular wire bonding process known as wedge bonding, the ultrasonic energy is supplied in the range of 1 to 50 watts, depending on the wire size used. The ultrasonic energy is directed to the aluminum wire by a special tool known as a "wedge". The wire is fed through a hole at the bottom of the wedge. When the wedge with the aluminum wire touches the surface to which the wire is to be bonded, movement is stopped. The wire is pressed down with a small defined force, known as the bonding weight, and the wire is slightly deformed. This small deformation is known as the "pre-deformation". Ultrasonic energy is now switched on, and the welding process starts. During this time, the diameter of the aluminum wire is reduced by a few microns, the actual reduction depending on the size, physical properties and the precise chemical nature of the wire.

In known wire bonding apparatus, the wire is fed directly from a wire feed spool to the bonding wedge and the amount of wire consumed during a bonding operation is not monitored.

It is important, particularly in an automatic wire bonding apparatus, for the operator to have as much control over the process as possible. In order to achieve this, it is important for the operator to have as much information as possible on the progress of the bonding operation. In this connection, it would be helpful to the operator to be able to monitor the amount of wire consumed, and also to monitor the wire to ensure that if the wire breaks or the feed jams, this can be remedied as soon as possible.

It is a disadvantage of known wire bonding apparatus that there is no provision in such apparatus for monitoring the amount of wire consumed, or whether there is any breakage or feeding difficulty with the wire.

It is an object of the present invention to provide a device for incorporation in an apparatus for wire bonding, in which the above disadvantages are reduced or substantially obviated.

BRIEF SUMMARY OF THE INVENTION

The present invention provides a device for incorporation in a wire bonding machine, for monitoring the supply of wire from a wire supply spool to a bonding wedge, which device comprises a mount for rotatably mounting a wire supply spool;

a guide wheel mounted on a lever, which lever can be deflected between a first position to which it is biassed by a spring and a second position at which it activates a sensor;

a motor for driving the wire supply spool, which motor is started by the sensor when the sensor is activated by the lever and means for stopping the motor when a predetermined amount of wire has been supplied, and wherein the wire passes over the wheel between the wire supply spool and the bonding wedge, so that the consumption of wire during a bonding cycle causes deflection of the lever from its first position to its second position.

In a first embodiment of the device according to the invention, where the amount of wire being used in a single bonding cycle is short, the means for stopping the motor when a predetermined amount of wire has been supplied comprises a second sensor, located so that it is activated by the spring-loaded lever in a third position of that lever, on the opposite side of the first position to that of the second position. The second sensor is preferably adjustable, to allow for the supply of different amounts of wire.

In an alternative embodiment of the device according to the invention, where the amount of wire being used is relatively long, the means for stopping the motor when a predetermined amount of wire has been supplied comprises a timer switch, which switches off the motor after a predetermined time.

The sensor or sensors provided in the device according to the invention may be any suitable type of sensors, for example magnetic sensors or light barriers: light barriers are particularly preferred. The sensor or sensors are preferably also connected to the control system for the bonding machine, to ensure that the bonding operation is only carried out when the correct amount of wire is being supplied, and there is no breakage in the wire.

BRIEF DESCRIPTION OF THE DRAWING

An embodiment of the device according to the invention will now be described with reference to the accompanying drawing, which shows a sectional view of the device.

DETAILED DESCRIPTION

A wire supply spool (1) is mounted for rotation about a pivot (2). A motor (3) is mounted adjacent to the spool (1) and has a rubber wheel (4) which is biassed by a spring (5) into engagement with the spool (1). A wire (6) is fed from the spool (1) over a grooved guide wheel (7) to the bonding wedge 11 of a wire bonder. The guide wheel (7) is preferably made of a plastics material and is mounted for free rotation about a bearing on the end of a lever (8) which is mounted on a pivot (9) and biassed by a spring (10). The lever (8) can be deflected about the pivot (9) between a first sensor (A) and a second, adjustable sensor (B) which supply signals to the controller C.

In operation, as the wire (6) is consumed during a bonding cycle, the guide wheel (7) is pulled down so that the lever (8) activates the sensor (A), which is preferably a light barrier. The sensor (A) sends a signal to start the motor (3) which is engaged with the spool (1). The motor (3) is started and turns the spool (1) so that wire (6) is supplied, until the lever (8) reaches the sensor (B) and the motor (3) is stopped.

The position of the sensor (B) can be adjusted as shown by the double-headed arrow to allow for the supply of different amounts of wire.

The spring loading of the rubber wheel (4) allows for slight variations in the dimensions of the wire supply spool (1).

The device according to the invention can be used to monitor the amount of wire consumed during a bonding cycle, to determine and indicate any breakages in the wire, and to identify any failures in the supply of wire from the spool. A breakage indicator 12 which is schematically indicated to be any conventional indicator.

The device according to the invention is particularly suitable for monitoring the supply and consumption of relatively thick bonding wire, in particular wire having a diameter of at least 4 mil, more particularly wire having a diameter of from 4 to 20 mil.

I claim:

1. A wire bonding machine for establishing a wire connection between a first bonding location and a second bonding location, wherein a selected length of wire will be bonded to and extend between said bonding locations comprising means for bonding a selected length of wire between spaced bonding locations,
an elongated lever pivotally mounted intermediate its ends,
means for biasing said lever for displacement in a selected direction around the pivot,
wire guide means at one end of said lever,
means for defining an angled wire path around said wire guide means,
sensor means for sensing the position of said lever when the ends of an unbroken wire is bonded between said spaced locations,
means for feeding wire to said wire guide means,
means for operating said feeding means in the event said bonding means is at said other one of said spaced locations and said sensor senses said lever,
means for stopping the operation of said feeding means when said selected length of wire is fed to said wire guide means, and
means for indicating a breakage in the bonded wire, said indicating means including said sensor means.

2. A wire bonding machine according to claim 1, wherein said stopping means comprises
second sensor means for sensing the position of said lever when said selected length of wire is fed to said wire guide means.

3. A wire bonding machine according to claim 2, further comprising means for adjustably mounting one of said sensors.

* * * * *